(12) United States Patent
Bez et al.

(10) Patent No.: US 7,227,171 B2
(45) Date of Patent: Jun. 5, 2007

(54) SMALL AREA CONTACT REGION, HIGH EFFICIENCY PHASE CHANGE MEMORY CELL AND FABRICATION METHOD THEREOF

(75) Inventors: Roberto Bez, Milan (IT); Fabio Pellizzer, Follina (IT); Caterina Riva, Milan (IT); Romina Zonca, Paullo (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 224 days.

(21) Appl. No.: 10/313,991

(22) Filed: Dec. 5, 2002

(65) Prior Publication Data
US 2003/0219924 A1    Nov. 27, 2003

(30) Foreign Application Priority Data
Dec. 5, 2001 (EP) ................................. 01128461

(51) Int. Cl.
H01L 29/04 (2006.01)
(52) U.S. Cl. ............................. 257/3; 257/4; 257/295; 257/E31.029; 438/3; 438/666; 438/947
(58) Field of Classification Search ........ 257/202–211, 257/295–310, 3, 4; 438/3, 666, 947
See application file for complete search history.

(56) References Cited

U.S. PATENT DOCUMENTS 5,789,277 A    8/1998  Zahorik et al. ............... 438/95
5,814,527 A    9/1998  Wolstenholme et al. ........ 438/5
5,952,671 A    9/1999  Reinberg et al. ............... 257/3

(Continued)

FOREIGN PATENT DOCUMENTS

WO    WO 00/57498       9/2000
WO    WO 02/09206 A1    1/2002

OTHER PUBLICATIONS

Palun, L. et al., "Fabrication of Single Electron Devices by Hybrid (E-Beam/DUV) Lithography," *Microelectronic Engineering 53*, pp. 167-170, 2000.
U.S. Appl. No. 09/276,273, filed Mar. 25, 1999, Klersy.

*Primary Examiner*—H. Jey Tsai
(74) *Attorney, Agent, or Firm*—Lisa K. Jorgenson; Robert Iannucci; Seed IP Law Group PLLC

(57) ABSTRACT

A contact structure, including a first conducting region having a first thin portion with a first sublithographic dimension in a first direction; a second conducting region having a second thin portion with a second sublithographic dimension in a second direction transverse to said first direction; the first and second thin portions being in direct electrical contact and defining a contact area having a sublithographic extension. The thin portions are obtained using deposition instead of lithography: the first thin portion is deposed on a wall of an opening in a first dielectric layer; the second thin portion is obtained by deposing a sacrificial region on vertical wall of a first delimitation layer, deposing a second delimitation layer on the free side of the sacrificial region, removing the sacrificial region to form a sublithographic opening that is used to etch a mold opening in a mold layer and filling the mold opening.

43 Claims, 13 Drawing Sheets

U.S. PATENT DOCUMENTS

| | | |
|---|---|---|
| 5,970,336 A | 10/1999 | Wolstenholme et al. .... 438/238 |
| 6,031,287 A | 2/2000 | Harshfield ................... 257/734 |
| 6,238,946 B1 | 5/2001 | Ziegler ........................ 438/50 |
| 6,313,604 B1 | 11/2001 | Chen ........................... 438/95 |
| 6,316,784 B1 | 11/2001 | Zahorik et al. ................ 257/3 |
| 6,440,837 B1 | 8/2002 | Harshfield ................... 438/618 |
| 6,512,241 B1 | 1/2003 | Lai ................................ 257/4 |
| 6,541,333 B2 | 4/2003 | Shukuri et al. ............. 438/243 |
| 6,545,287 B2 | 4/2003 | Chiang ........................... 257/3 |
| 6,613,604 B2 * | 9/2003 | Maimon et al. .............. 438/95 |
| 6,617,192 B1 * | 9/2003 | Lowrey et al. ................ 438/95 |
| 6,750,079 B2 | 6/2004 | Lowrey et al. ................ 438/95 |
| 6,943,365 B2 | 9/2005 | Lowrey ........................... 257/3 |
| 6,969,866 B1 | 11/2005 | Lowrey et al. ................. 257/3 |
| 2001/0002046 A1 | 5/2001 | Reinberg et al. ................ 257/3 |
| 2002/0017701 A1 | 2/2002 | Klersy et al. ................ 257/536 |
| 2002/0036931 A1 | 3/2002 | Lowrey et al. ............. 365/200 |
| 2002/0060334 A1 | 5/2002 | Shukuri et al. ............. 257/306 |
| 2002/0070401 A1 | 6/2002 | Takeuchi et al. ............ 257/296 |
| 2003/0047762 A1 | 3/2003 | Lowrey ..................... 257/276 |
| 2003/0075778 A1 * | 4/2003 | Klersy ........................ 257/536 |
| 2003/0219924 A1 | 11/2003 | Bez et al. .................... 438/102 |
| 2003/0231530 A1 | 12/2003 | Bez et al. .................... 365/200 |
| 2004/0011381 A1 | 1/2004 | Klebanoff et al. ............. 134/2 |
| 2004/0012009 A1 | 1/2004 | Casagrande et al. ............ 257/4 |
| 2004/0166604 A1 | 8/2004 | Ha et al. ..................... 438/102 |
| 2004/0245603 A1 | 12/2004 | Lowrey et al. ............. 257/536 |

* cited by examiner

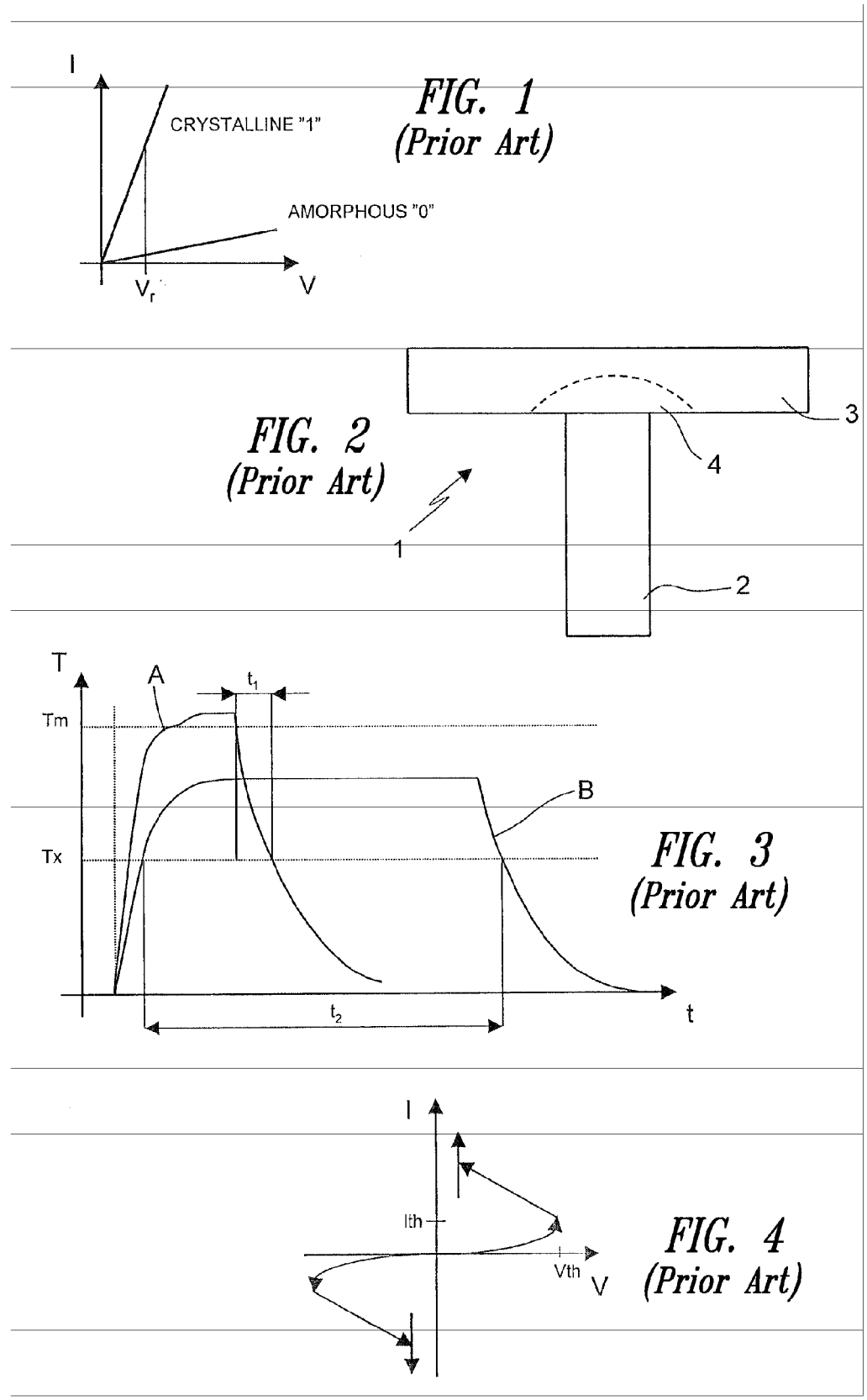

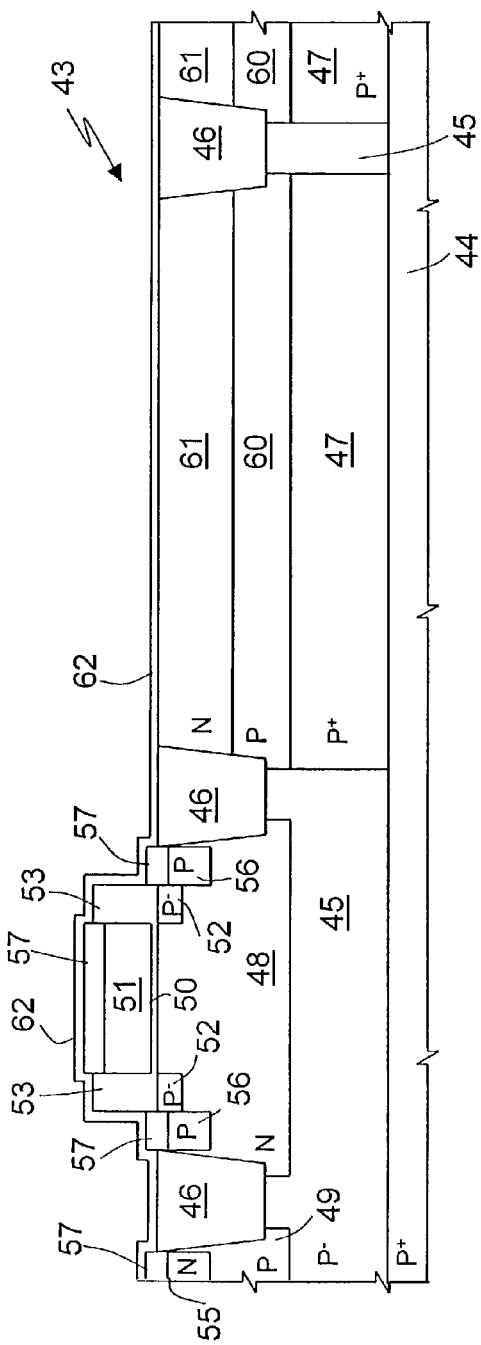

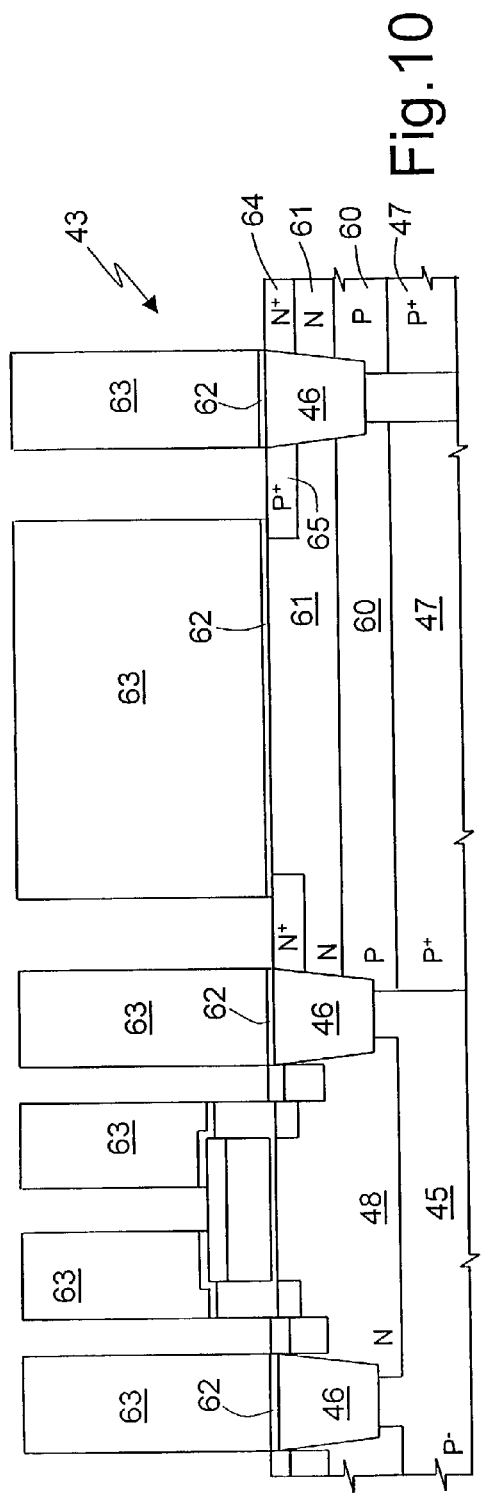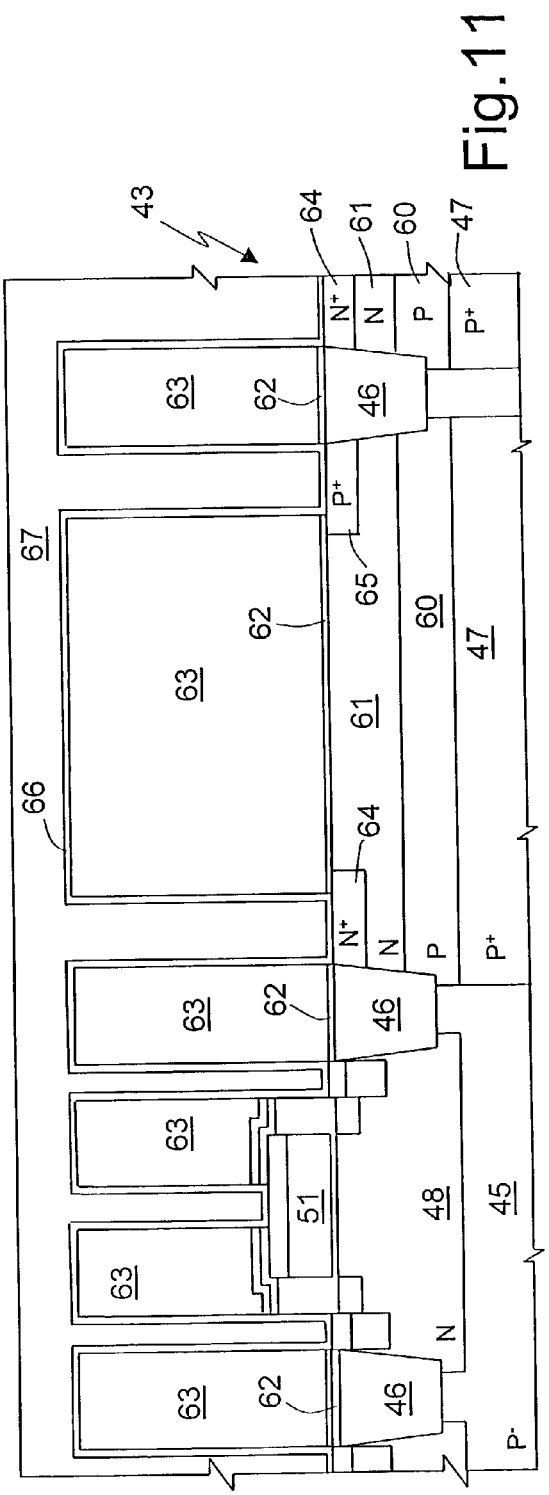

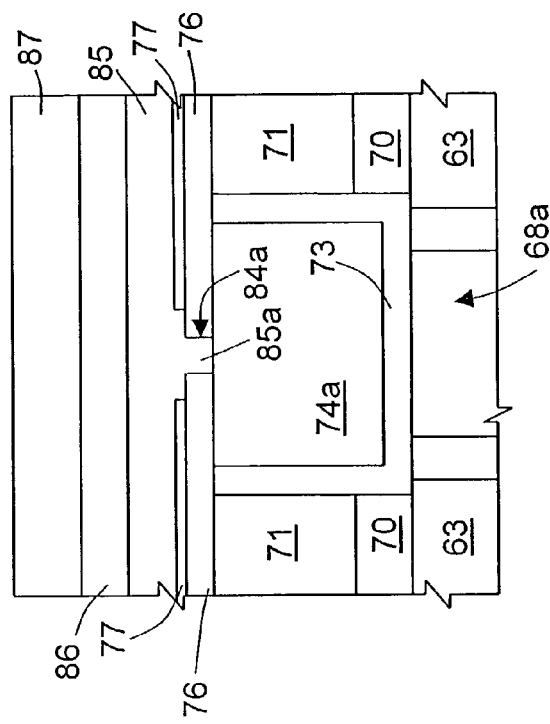
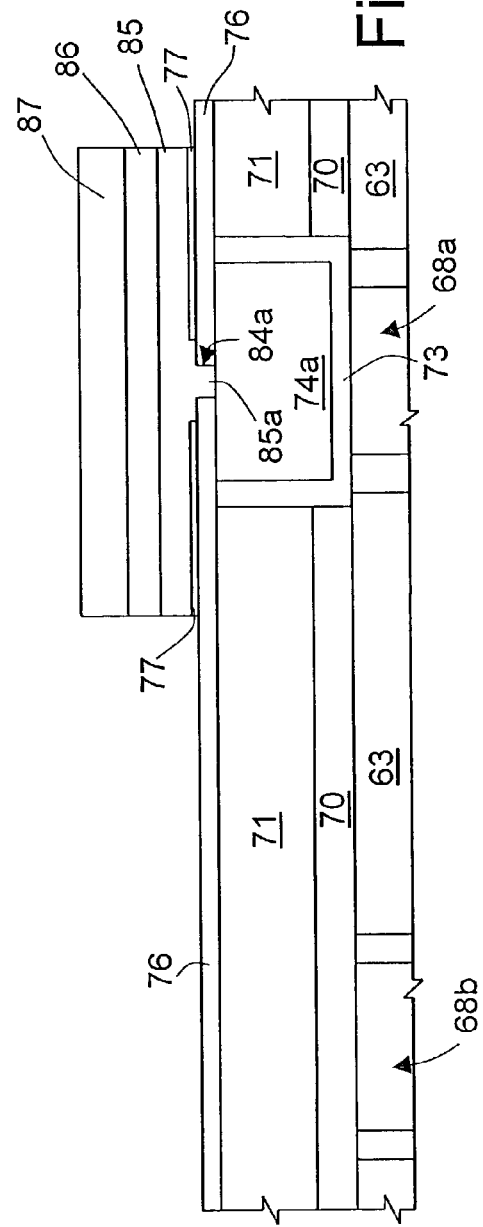

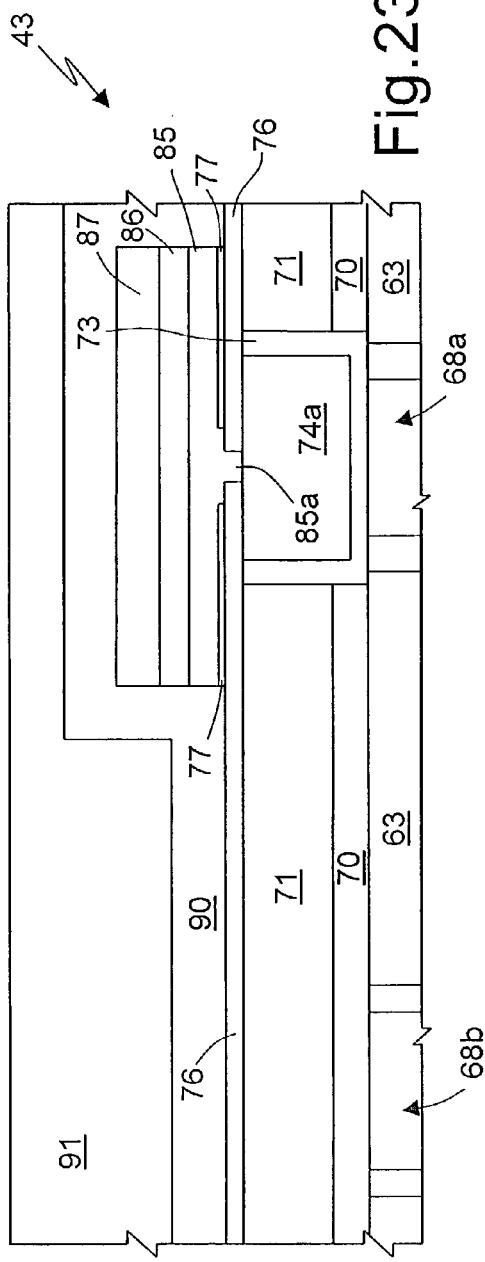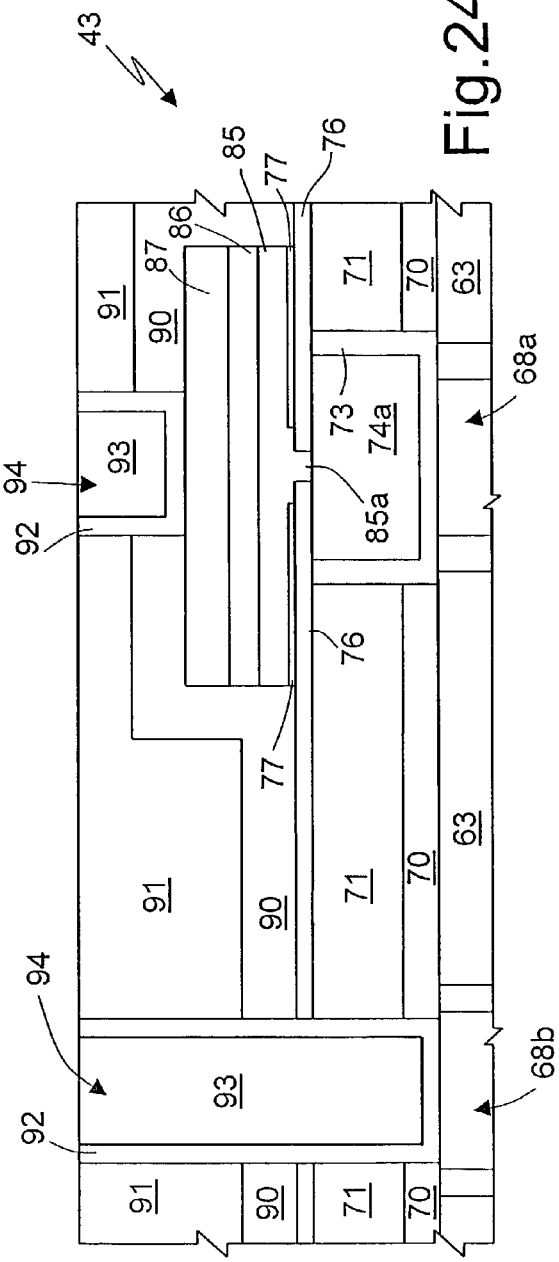

SMALL AREA CONTACT REGION, HIGH EFFICIENCY PHASE CHANGE MEMORY CELL AND FABRICATION METHOD THEREOF

BACKGROUND OF THE INVENTION

1. Field of the Invention

The present invention relates to a small area contact region, a high efficiency phase change memory cell and a fabrication method thereof.

2. Description of the Related Art

As is known, phase change memory cells utilize a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states.

Specific materials that may be suitably used in phase change cells are alloys of elements of the VI group of the periodic table, such as Te or Se, also called chalcogenides or chalcogenic materials. Therefore, hereinafter, the term "chalcogenic materials" is used to indicate all materials switchable between at least two different phases where they have different electrical properties (resistances) and include thus the elements of the VI group of the periodic table and their alloys.

The presently most promising chalcogenide is an alloy of Ge, Sb and Te ($Ge_2Sb_2Te_5$) which is already widely used for storing information in overwritable optical disks.

As indicated, for microelectronics applications, the interesting parameter is resistivity that varies of two or more orders of magnitude when the material transforms from the amorphous phase (more resistive) to the crystalline phase (more conductive) and vice versa. Thus a thin film of chalcogenic material may be employed as a programmable resistor, switching between a high and a low resistance condition, with a resistance change ratio higher than 40, as shown in FIG. 1, wherein Vr indicates the read voltage.

Phase change may be obtained by locally increasing the temperature. Under 150° C., both phases are stable. Over 200° C., nucleation of crystallites is fast and if the material is kept to the crystallization temperature for a sufficient time, it changes phase and becomes crystalline. In order to change the phase back to the amorphous state, its temperature is brought over the melting point (about 600° C.) and rapidly cooled.

From an electrical point of view, it is possible to reach both critical temperatures (crystallization and melting temperatures) using an electric current flow through a resistive electrode in contact or close proximity with the chalcogenic material and heating the material by Joule effect.

A chalcogenic element 1 based on the above is shown in FIG. 2, and comprises a resistive electrode 2 and a chalcogenic region 3. The chalcogenic region 3 is generally in the crystalline state to allow good current flow. A portion of the chalcogenic region 3 is in direct contact with the resistive electrodes and forms a phase change portion 4.

By passing an electrical current of suitable value through the resistive electrode 2, it is possible to selectively heat the phase change portion 4 to the crystallization or melting temperatures and cause a phase change.

FIG. 3 shows the plots of the required temperature versus time when a phase change from the crystalline to the amorphous status is desired (curve A) and a phase change from the amorphous to the crystalline status is desired (curve B). $T_m$ indicates the melting temperature and $T_x$ indicates the temperature at which crystallization begins. As shown, amorphization requires a short time (reset pulse) but a high temperature; furthermore the material should be cooled in a very short time ($t_1$) to maintain the atomic disorder and avoid recrystalization of the material. Crystallization requires a longer time $t_2$ (also called set pulse) to allow nucleation and crystal growing.

The state of the chalcogenic material may be read applying a sufficiently small voltage so as not to cause a sensible heating and measuring the current passing through it. Since the current is proportional to the conductance of the chalcogenic material, it is possible to discriminate between the two states.

Of course, the chalcogenic material may be electrically switched between different states intermediate between the amorphous and the crystalline states, thereby giving rise to a multilevel storing capability. In the following however, for sake of clarity, the binary situation will be considered, without the invention being limited thereto.

The possibility of changing the phase from the amorphous to the crystalline state using electrical pulses is indeed not immediately obvious, since, in the amorphous state, the material resistivity is very high and the current flowing through the chalcogenic material would not allow a sufficient dissipation and thus a sufficiently high temperature. However, chalcogenic materials have the property that they change their transport characteristics as a function of the applied electric field. This is shown in FIG. 4, plotting the curve of the current as a function of the voltage for a structure formed by a chalcogenic material arranged between two metal electrodes.

As visible, above a threshold voltage Vth, the structure begins to conduct not following a phase change, but because of a change in the electronic conduction mechanism. This behavior is called "electronic switching"; accordingly, biasing the chalcogenic structure to a voltage higher than the threshold voltage, it is possible to considerably increase the current flow. By causing this current to pass through a suitable neighboring series resistor, that operates as a heater, it is thus possible to obtain, by Joule effect, a sufficient heating of the chalcogenic material up to the crystallization temperature.

The use of the chalcogenic element of FIG. 2 has been already proposed to form a memory cell. To avoid disturbances caused by adjacent memory cells, the chalcogenic element is generally coupled with a selection element, such as a MOS transistor, a bipolar transistor or a diode.

All known approaches however are disadvantageous due to the difficulty of implementing solutions that satisfy present requirements regarding current and voltage withstand capability, functionality, as well as compatibility with current CMOS technologies.

In particular, technological and electrical considerations impose a limit onto the maximum value of the current usable to cause phase change in the memory cells. Indeed, considerations about the present current capability of transistors in a technology with a gate length of 130 nm and a gate oxide withstanding a power supply of 3 V, for memory devices of the present generation (working by 8 or 16 or 32 bits), impose maximum current values of about 100–200 μA that in turn require a contact area between the chalcogenic region and the resistive electrode in the range of preferably, at the most, 20 nm×20 nm. The problem is that such dimensions are far ahead of the present optical (UV) lithography that can hardly reach a linear 100 nm definition.

BRIEF SUMMARY OF THE INVENTION

An embodiment of the invention provides a contact region, in particular for a phase change memory cell, and a fabrication method thereof that solve the above problem.

In order to manufacture the small contact region between, e.g., the chalcogenic region and the resistive electrode, according to one embodiment of the invention, the contact area is defined by the intersection of two transverse thin portions having a sublithographic dimension, that is a dimension that is lower than a minimum dimension obtainable through optical UV lithography. According to another embodiment of the invention, to form the sublithographic dimensions, the deposition of layers instead of lithography is exploited. This embodiment is based on the fact that actual existing technologies allow very thin layers (having a thickness much lower than the lithographic dimension) to be deposited with a good precision.

Preferably, also the height of the phase change portion is determined by the thickness of a suitable deposited film, so that the phase change portion has a very small volume.

In particular, the resistive electrode includes a thin wall formed by a deposed resistive layer. For example, the resistive layer is deposed onto at least a side wall surface of a cavity in an insulating layer. The chalcogenic region is obtained by filling a slit formed in a dielectric material. The slit may be simply obtained by removing a sacrificial region deposed on a side wall surface of a first delimitation layer. Thereafter, a second delimitation layer is deposed which, together with the first delimitation layer, laterally delimits a slit. In the alternative, the delimitation layers form a hard mask for an underlying dielectric layer that defines a mold layer and the slit is formed as above indicated in the delimitation layers; the dielectric layer is etched under the slit to form a molding aperture; after removing the hard mask, the molding aperture is filled with the chalcogenide.

To improve the adhesion of the chalcogenic material to the underlying structure, in particular to the dielectric material that forms the molding aperture, according to a further embodiment of the invention, an adhesion film is used. Preferably, titanium or polysilicon is used as the adhesion film.

The process is studied so as to be fully compatible with a standard and up-to-date CMOS processes. To this end, the phase change memory cells are manufactured after the operations relative to the front-end, wherein the active elements of the circuits (the elementary components such as transistors diodes, resistors, etc.) are formed and before the operations relative to the back-end, wherein the interconnections for electrically connecting the elementary components are formed.

BRIEF DESCRIPTION OF THE SEVERAL VIEWS OF THE DRAWING

For the understanding of the present invention, a preferred embodiment is now described, purely as a non-limitative example, with reference to the enclosed drawings, wherein:

FIG. 1 illustrates the characteristic current-voltage of a phase change material;

FIG. 2 shows the basic structure of a known chalcogenic element;

FIG. 3 plots the temperature versus time that causes a phase change for the chalcogenic element of FIG. 2;

FIG. 4 plots the current versus voltage of a chalcogenic material subject to electronic switching;

FIGS. 8–25 show cross-sections through a semiconductor wafer in successive manufacturing steps of a phase change memory cell.

DETAILED DESCRIPTION OF THE INVENTION

Figure 5:
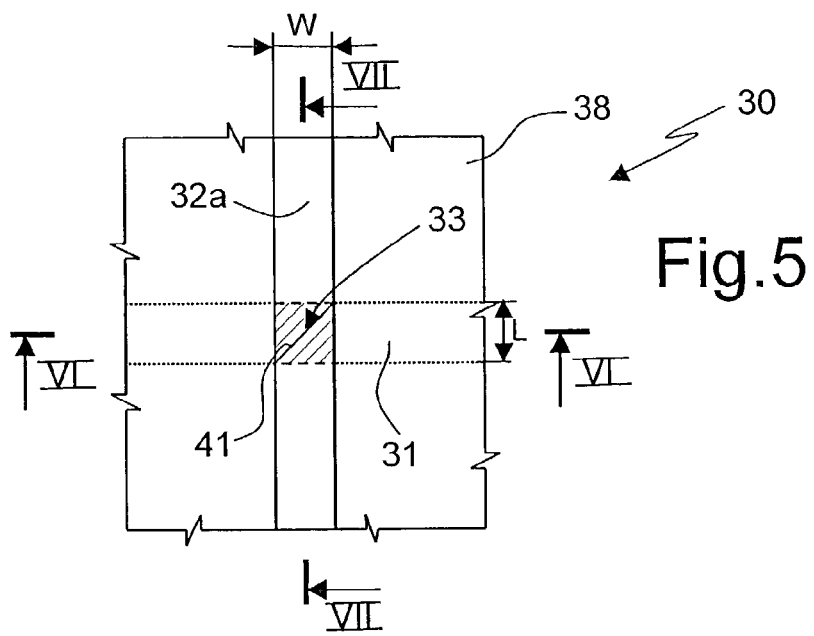
FIG. 5 shows a contact region between the resistive electrode and the chalcogenic region, in a horizontal cross-section taken along line V—V of FIG. 6, according to a first embodiment of the invention.
Figure 6:
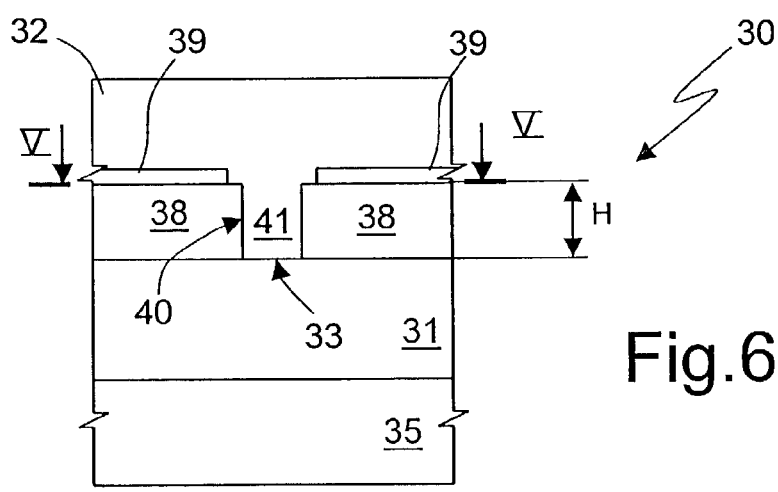
FIG. 6 is a cross-section of the contact area of FIG. 5, taken along line VI—VI of FIG. 5.
Figure 7:
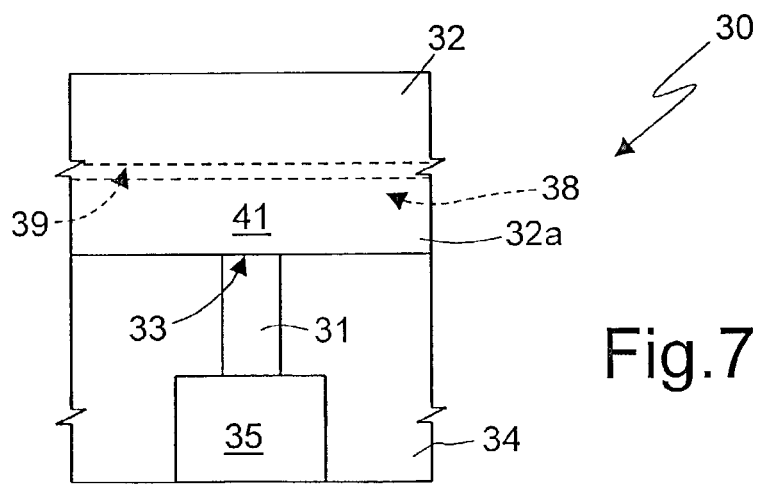
FIG. 7 is a cross-section of the contact area of FIG. 5, taken along line VII—VII of FIG. 5.
Figure 12:
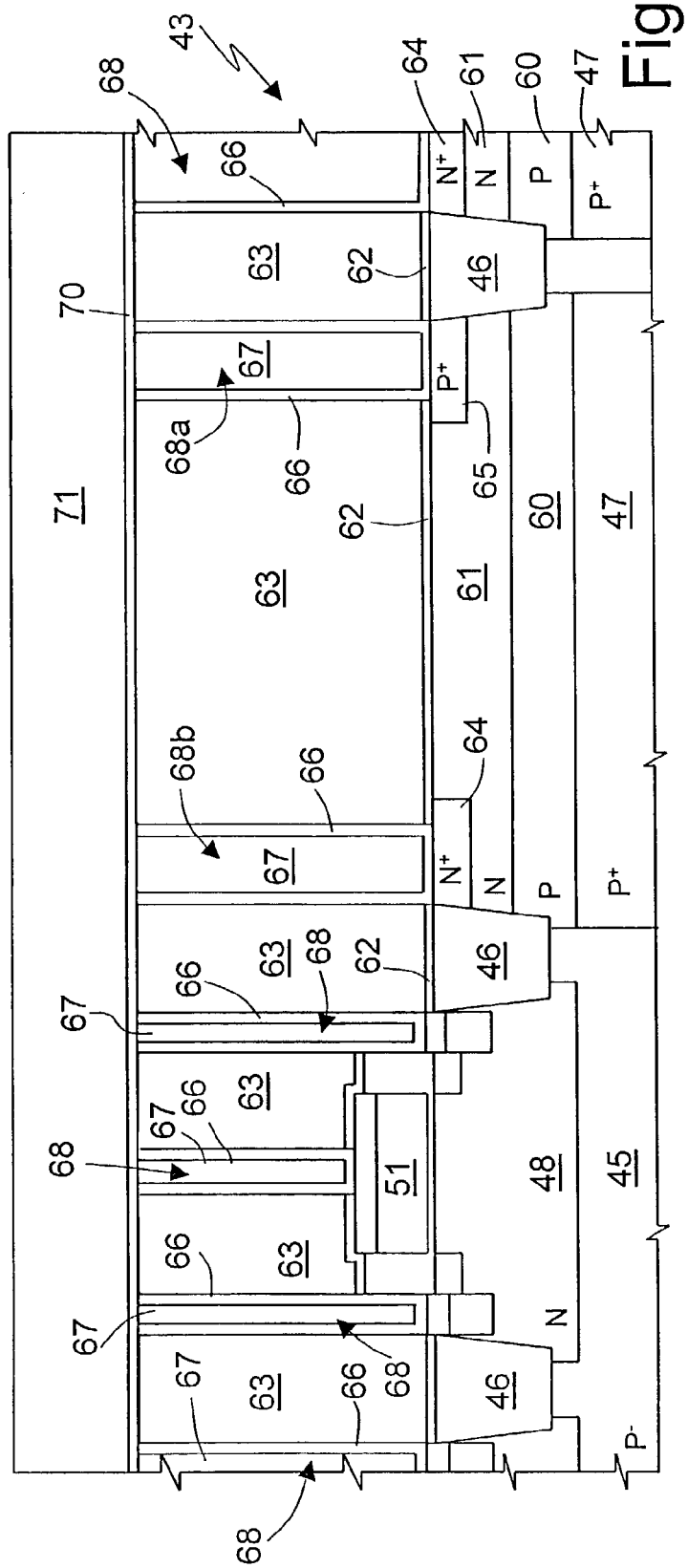

FIGS. 5–7 illustrates a contact region 30 of, e.g., a phase change memory cell including a resistive electrode 31 and a chalcogenic region 32 in direct electric contact at a contact area 33.

The resistive electrode 31 is formed by a thin region having a thickness L, extending in a first dielectric layer 34. The resistive electrode 31 is of a material with selected resistivity (e.g., with a resistivity of 0.1–100 mΩ cm, preferably 1–10 mΩ cm), stable with temperature (at least up to 700–800° C., that is just above the phase change material melting temperature), which is CMOS-compatible and has a good interface with the phase change material (chalcogenic material). For example, the resistive electrode 31 may be of TiSiN, TiAlN or TiSiC.

Below the resistive electrode 31 is a resistive support region 35, also surrounded by the dielectric layer 34 and connected to a selection element (not shown); on top of the first dielectric layer 34 there extends a second dielectric layer 38 covered by an adhesion layer 39. The second dielectric layer 38 and the adhesion layer 39 form a slit or opening 40 extending, at least near the contact area 33, perpendicularly to the resistive electrode 31. The slit 40 may have any shape, for example circular (here approximated by a straight line) and is slightly larger at the adhesion layer 39. In FIG. 7, the upper surfaces of the second dielectric layer 38 and of the adhesion layer 39 are indicated by dotted lines, for better comprehension.

The chalcogenic region 32 extends on the adhesion layer 39 and fills the slit 40, thereby contacting the resistive electrode 31 with a thin chalcogenic portion 32a, the width whereof is determined by the width of the slit 40 (indicated by W in FIG. 5). The intersection between the thin chalcogenic portion 32a and the resistive electrode 31 thus forms the contact area 33 and the volume of the thin chalcogenic portion 32a extending above the contact area 33 forms a phase change region 41, whose base is W×L and whose height H equals the thickness of the second dielectric layer 38, as shown in FIG. 6.

According to one embodiment of the invention, the dimensions W, L and H are determined by the thickness of deposited layers, as below explained by way of an example for an embodiment of a manufacturing process. In particular, dimensions W, H, L are lower than 100 nm, preferably lower than 50 nm and more preferably of about 20 nm, as it will be clear from the following description, made with reference to FIGS. 8–25, wherein the different layers and structures are not drawn in scale. The described exemplary process is directed to the manufacture of an electronic device including circuitry transistors made in the CMOS technology and a phase change cell memory.

Initially a wafer 43, comprising a substrate 44 of $P^+$-type and an epitaxial layer 45 of $P^-$-type silicon, is subject to standard front-end steps, as rapidly summarized hereinbelow.

Referring to FIG. 8, active areas are defined in the substrate 45. To this end, insulating regions 46 are formed within the substrate, e.g., using the "shallow trench" technology. Then, in the array portion (on the right in the Figure) buried subcollector regions 47 of $P^+$-type are implanted to extend down to the substrate 44. After annealing, N-wells 48 and P-wells 49 are implanted, using separate masks. Furthermore, doping of the channels of the periphery transistors is carried out.

Thereafter, an oxide layer 50 is grown onto the entire surface of the epitaxial layer 45 and a polysilicon layer of preferably 250 nm is deposed. The polysilicon layer is then defined, to form gate regions 51 of the periphery transistors. After source and drain reoxidation, LDD implants are carried out for both P-channel and N-channel periphery transistors, to form P-type, light doped regions 52 and analogous, not shown, N-type light doped regions.

Then, a salicide protection mask (not shown) is formed over the array portion; a dielectric material (oxide) with a thickness of 220 nm is deposed onto the whole wafer 43 and etched, to form spacers 53 on the sides of the gate regions 51; source and drain regions 55, 56 for the N-channel and P-channel periphery transistors are implanted and salicide regions 57 are grown over the gate regions 51 and the source and drain regions 55, 56, in a per se known manner.

After removing the salicide protection mask, collector regions 60 of P-type and base regions 61 of N-type are implanted over the buried sub-collector regions 47; then a first nitride layer 62 with a thickness of 60 nm is deposed. Thus, the structure of FIG. 8 is obtained.

Thereafter, FIG. 9, a first dielectric layer 63 (preferably, USG—Undoped Silicate Glass—with a thickness of 700 nm) is deposed and planarized down to about 600 nm. Then first dielectric layer 63 and first nitride layer 62 are etched where contact are to be formed so as to uncover portions of salicide regions 57 and base region 61.

Then, FIG. 10, a base contact region 64 of $N^+$-type and, subsequently, an emitter region 65 of $P^+$-type are implanted into base region 61. Base region 61, base contact region 64 and emitter region 65 form a diode; in particular, base region 61 forms the cathode and emitter region 65 forms the anode of the diode.

A first barrier layer 66, e.g., a multiple Ti/TiN layer with a thickness of about 70 nm, is deposited onto the whole wafer 43, FIG. 11, thereby conformally covering all sides of the first dielectric layer 63 and the exposed portions of the epitaxial layer 45. A W layer 67 with a thickness of about 300 nm is then deposited and fills the openings in the first dielectric layer 63. The wafer 43 is then planarized, e.g., by CMP (Chemical Mechanical Polishing), to obtain a total thickness of layers 63 and 62 of about 500 nm, measured from the surface of the epitaxial layer 45, FIG. 12. The remaining portions of the first barrier layer 66 and W layer 67 form first-level plugs 68; in particular a storage element plug 68a is formed on emitter region 65 and a word-line plug 68b is formed on base contact region 64. Then a second nitride layer 70 with a thickness of 60 nm and, thereover, a second dielectric layer 71, e.g., USG with a thickness of 240 nm, are deposited.

Figure 13:
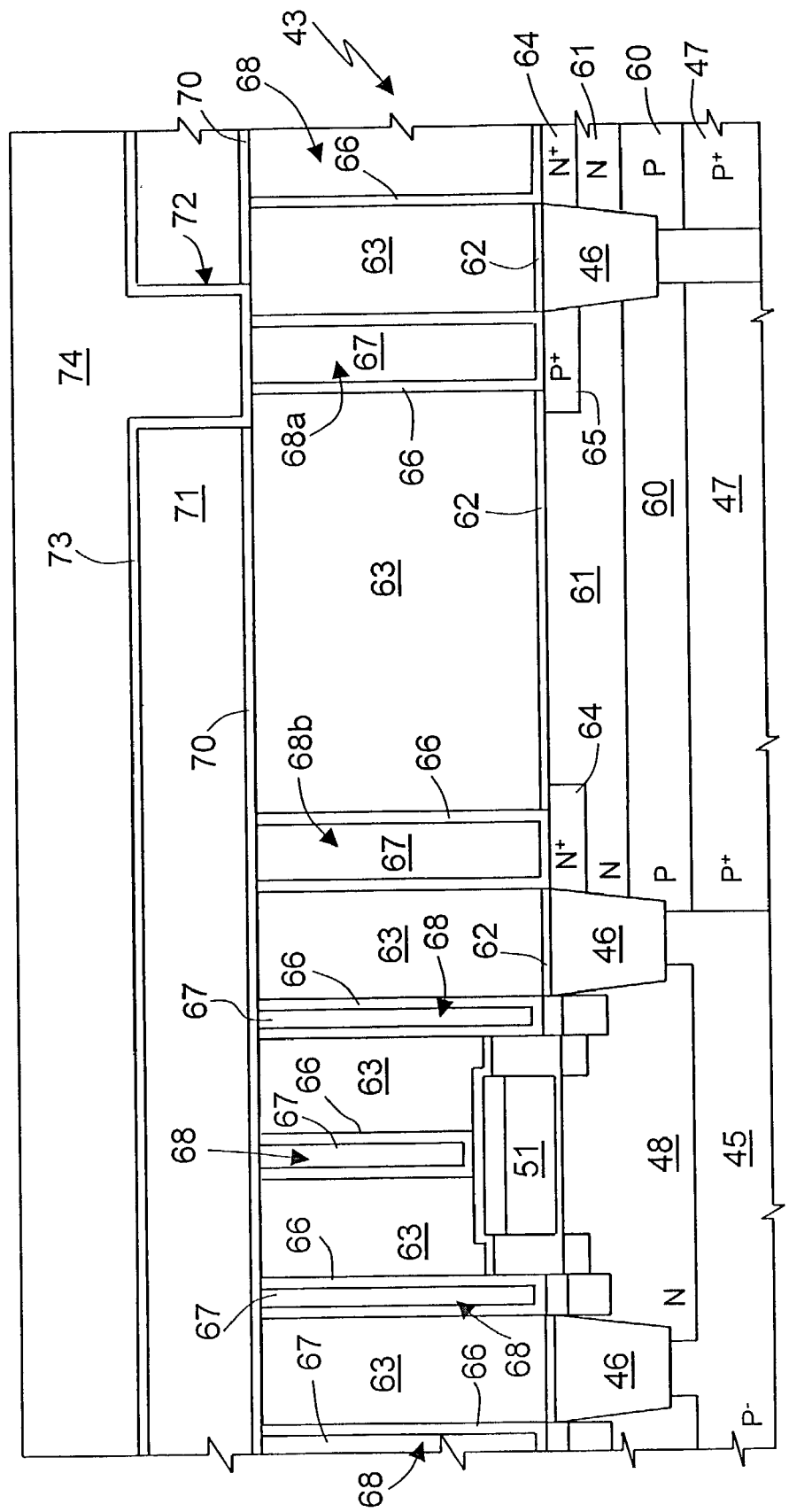

Thereafter, FIG. 13, an opening 72 is formed in the second dielectric layer 71 and in the second nitride layer 70, to reach the surface of the first dielectric layer 63. Opening 72 has dimensions given by the lithography, for example it may have an annular shape with a minimum dimension of 0.2 μm. Then, a heater layer 73 is deposed. The heater layer 73, intended to form resistive electrode 31 of FIGS. 5–7, has a thickness of 10–50 nm, preferably 20 nm, and the above discussed properties as resistivity, temperature stability, and good compatibility with CMOS processes and chalcogenides. For example, TiSiN, TiAlN or TiSiC is used, which conformally covers the side wall surface and the bottom surface of the opening 72. Then a third dielectric layer 74 is deposed and completely fills the opening 72. The material of the third dielectric layer 74, as well as the material of the second dielectric layer 71, is preferably a low conductivity or "low-K" type, to limit heating diffusion (as indicated, the heater should be able to generate as high temperatures as 600° C., for ensuring melting of the chalcogenic materials and transition to the amorphous phase). The third dielectric layer 74 may be for example USG with a thickness of 300 nm, or other porous dielectric material (e.g., xerogels).

Figure 14:
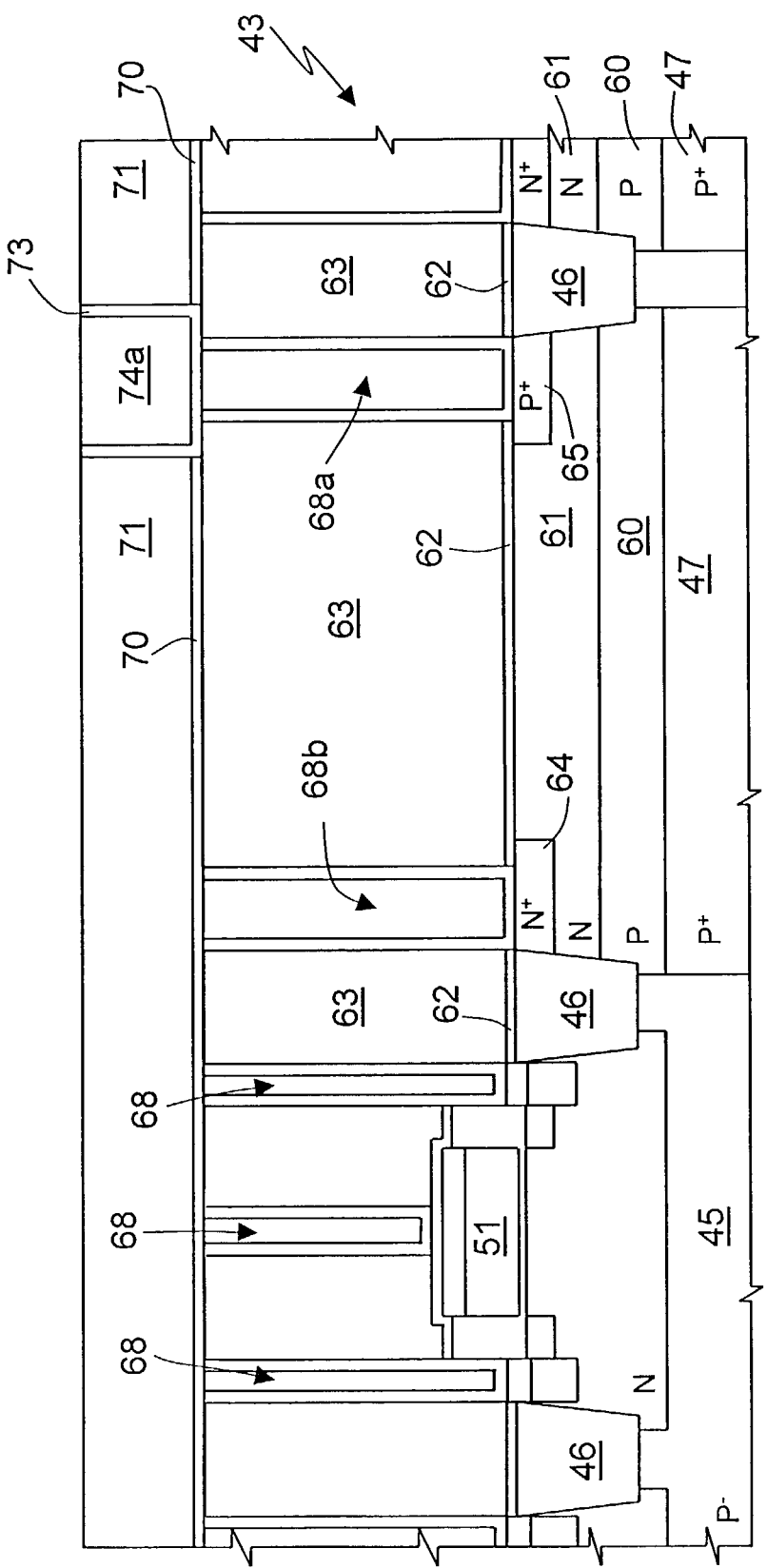

Then, FIG. 14, the wafer 43 is planarized, e.g., by CMP, to obtain a total thickness of the second nitride layer 70 and second dielectric layer 71 of about 200 nm. Thus, the heater layer 73 is completely removed from above the second dielectric layer 71, and remains only in the opening 72, defining a cup-shaped heater, extending, in a top view, along a closed line and housing the remaining portion 74a of the third dielectric layer 74.

Figure 15:
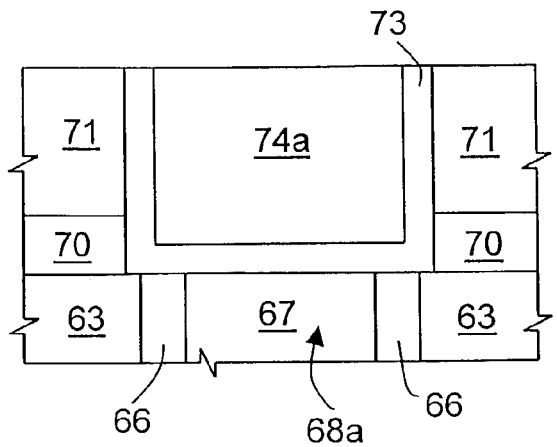

FIG. 15 represents a detail of FIG. 14, in enlarged scale, to better show a contact area analogous to the reduced contact area 33 of FIG. 5.

Figure 16:
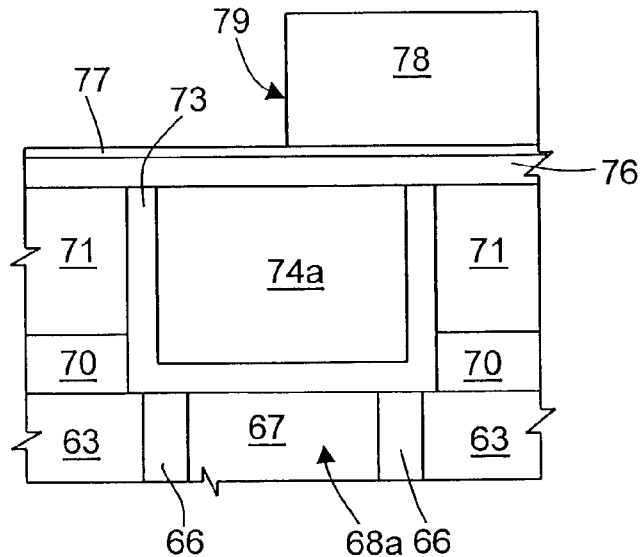

In sequence, FIG. 16, a mold layer 76 of dielectric material, for example USG or a low-K material with a thickness of 20 nm, an adhesion layer 77, for example Ti or Si with a thickness of 5 nm, and a first delimitation layer 78, for example nitride or other material that allows selective etching with respect to the mold layer 76 and adhesion layer 77, are deposited. First delimitation layer 78 has a thickness of, e.g., 150 nm.

Using a mask, part of the first delimitation layer 78 is dry etched to expose the adhesion layer 77; thereby a step is formed having a vertical side 79 extending above portion 74a, along about a central line thereof.

Figure 17:
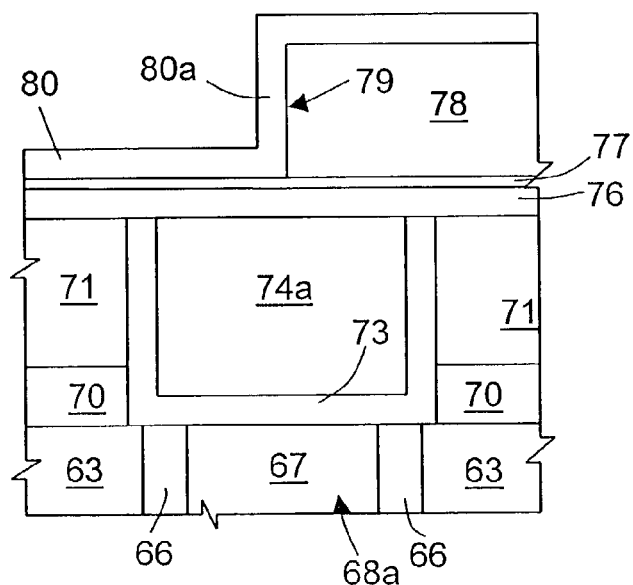

Then, FIG. 17, a sacrificial layer 80, for example TiN with a thickness of 30 nm, is conformally deposited; in particular, sacrificial layer 80 forms a vertical wall portion 80a extending against vertical side 79 of first delimitation layer 78. The height of the vertical wall portion 80a (depending on the thickness of the first delimitation layer 78) and its width (equal to of thickness of the sacrificial layer 80) is a critical parameter in defining the width W of the phase change region 41 (FIG. 6), as it will be clear hereinafter.

Figure 18:
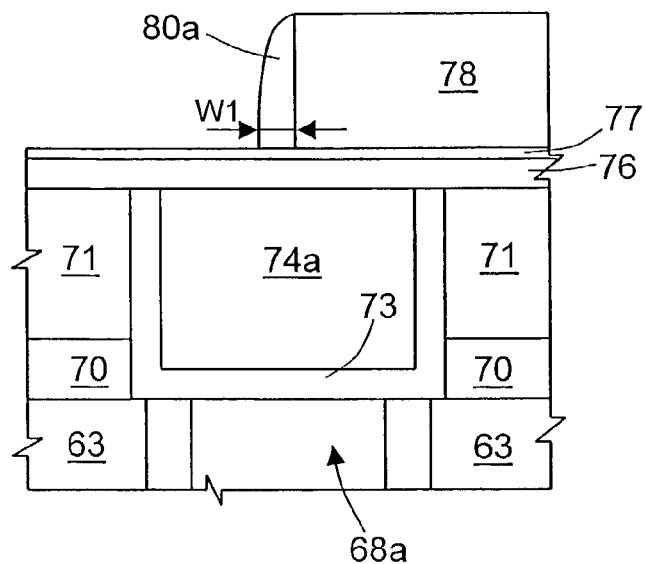

Thereafter, FIG. 18, the sacrificial layer 80 is subject to etch back, thereby removing the horizontal portions of the sacrificial layer 80 and part of the vertical wall portion 80a including the upper portion and a thin side portion. By suitably selecting the thickness of the first delimitation layer 78, the thickness of the sacrificial layer 80, the material of the sacrificial layer 80, time and type of etching, the remaining vertical wall portion 80a has a lower portion which is rectangular and has a width W1 that equals the desired width W (20 nm) of the phase change region (41 in FIG. 6).

Figure 19:
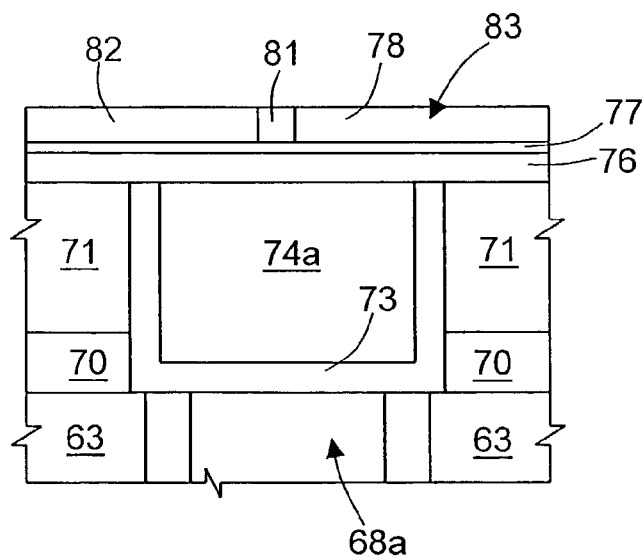

According to FIG. 19, a second delimitation layer 82 of the same material as the first delimitation layer 78 (e.g., nitride with a thickness of 300 nm) is then deposited and covers the adhesion layer 77, where exposed (on the left in the drawings), the vertical wall portion 80a and the first delimitation layer 78; then the delimitation layers 78, 82 as well as the vertical wall portion 80a are thinned to the desired height using CMP. At the end, the remaining portions of the delimitation layers 78, 82 form a hard mask 83, and the remaining portion of the vertical wall portion 80a forms a sacrificial region 81.

Figure 20:
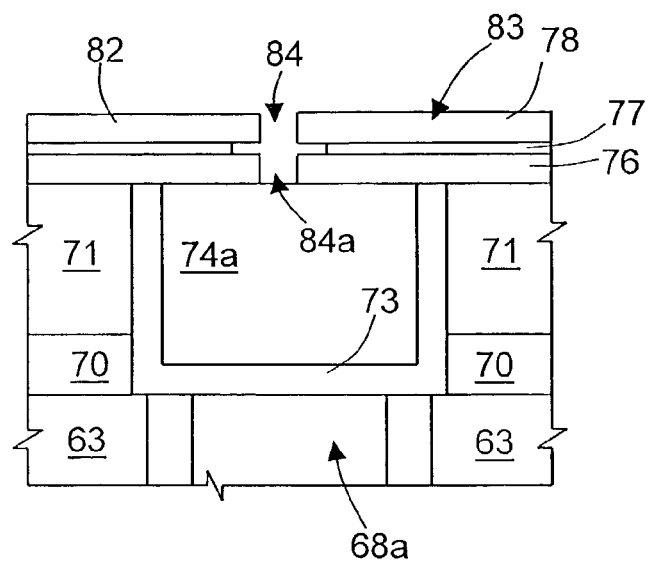

Thereafter, FIG. 20, the sacrificial region 81 is removed, thereby an opening 84 is formed in the hard mask 83 that has equal dimensions as the phase change region to be formed; adhesion layer 77 is then isotropic etched and mold layer 76 is dry etched. As visible from FIG. 20, by virtue of the isotropic etching of the adhesion layer 77, portions of the latter are removed below the delimitation layers 78, 82 and the removed portion is larger than the opening 84 in the hard mask 83; on the contrary, by virtue of the dry etching, the opening 84a formed in the mold layer 76 has the same shape and in particular the same width as the opening 84 in the hard mask 83.

Hard mask 83 is removed, FIG. 21, and a chalcogenic layer 85, e.g., $Ge_2Sb_2Te_5$ with a thickness of 60 nm, is conformally deposed. Preferably, chalcogenic layer 85 is deposed by PVD (Physical Vapor Deposition) at an appropriate temperature to be in the crystalline phase. The portion 85a of the chalcogenic layer 85 filling the opening 84a in the mold layer 76 is analogous to the thin chalcogenic portion 32a of FIGS. 5 and 7; its intersection with the heater layer 73 (not visible in FIG. 21) defines the phase change region 41 of FIGS. 5, 6. As visible, portion 85a of the chalcogenic layer 85 has a height that is equal to the thickness of mold layer 76; thus also the height of portion 85a depends on the thickness of a deposed layer and may be sublithographic. By virtue of the adhesion layer 77 having a larger opening than opening 84a, the portion 85a is not in direct contact with the adhesion material and thus cannot either be contaminated thereby or allow heat escape.

On top of the chalcogenic layer 85, a second barrier layer 86, e.g., two-layer Ti/TiN with a thickness of 70 nm, and thereon a first metal layer 87, e.g., AlCu with a thickness of 150 nm, are deposed. Also these layers, as well the subsequent ones, are deposed at an appropriate temperature (lower than the chalcogenide melting temperature but above the crystallization temperature), to avoid damage of the chalcogenic layer 85.

As shown in FIG. 22, drawn at a smaller scale than FIG. 21, the stack formed by first metal layer 87, the second barrier layer 86, the chalcogenic layer 85 and the adhesion layer 77 are then defined, using a same mask, to form a bit line. The total thickness of the stack 87, 86, 85 and 76 is about 300 nm.

According to FIG. 23, a first oxide layer 90 and a second oxide layer 91 are deposed at low temperature. Preferably the first oxide layer 90 is a low thermal conductivity oxide (e.g., USG) that has the task of sealing the first metal layer 87 and the chalcogenic layer 85 and is deposed at low temperature (e.g., 300° C.) with a thickness of 150 nm, so as not to cause damage in the chalcogenic layer 85. Thereby, the manufacturing steps specific for the phase change storage end are ended and standard back end steps are carried out. Thus, the second oxide layer 91 is a standard oxide with a thickness of, e.g., 600 nm.

Then the wafer 43 is planarized, e.g., by CMP, to obtain a total height of the stack formed by the second nitride layer 70, the second dielectric layer 71, the mold layer 76 and the first and second oxide layers 90, 91 (at the side of the stack formed by layers 77, 85–87) of about 800 nm. In practice, the height of the layers above the first metal layer 87 is about 300 nm.

Then, FIG. 24, contacts are formed to electrically contact the first-level plugs 68, 68b and the first metal layer 87. To this end, on top of first-level plugs 68, 68b, the second oxide layer 91, the first oxide layer 90, the mold layer 76, the second dielectric layer 71 and the second nitride layer 70 are opened and, on top of the storage element plug 68a, the second and the first oxide layers 91, 90 are opened (oxide etch). Then, a third barrier layer 92, e.g., of Ti/TiN, is deposed and the openings are filled with a conductive layer 93, e.g., W with a thickness of 300 nm. The structure is planarized to remove the horizontal portions of the conductive layer 93 and of the third barrier layer 92 and so form second-level plugs 94 in direct electrical contact with the first-level plugs 68, 68b (as shown in FIG. 24 for the first-level plug 68b in contact with base contact region 64) or the first metal layer 87 (over the storage element plug 68a).

Figure 25:
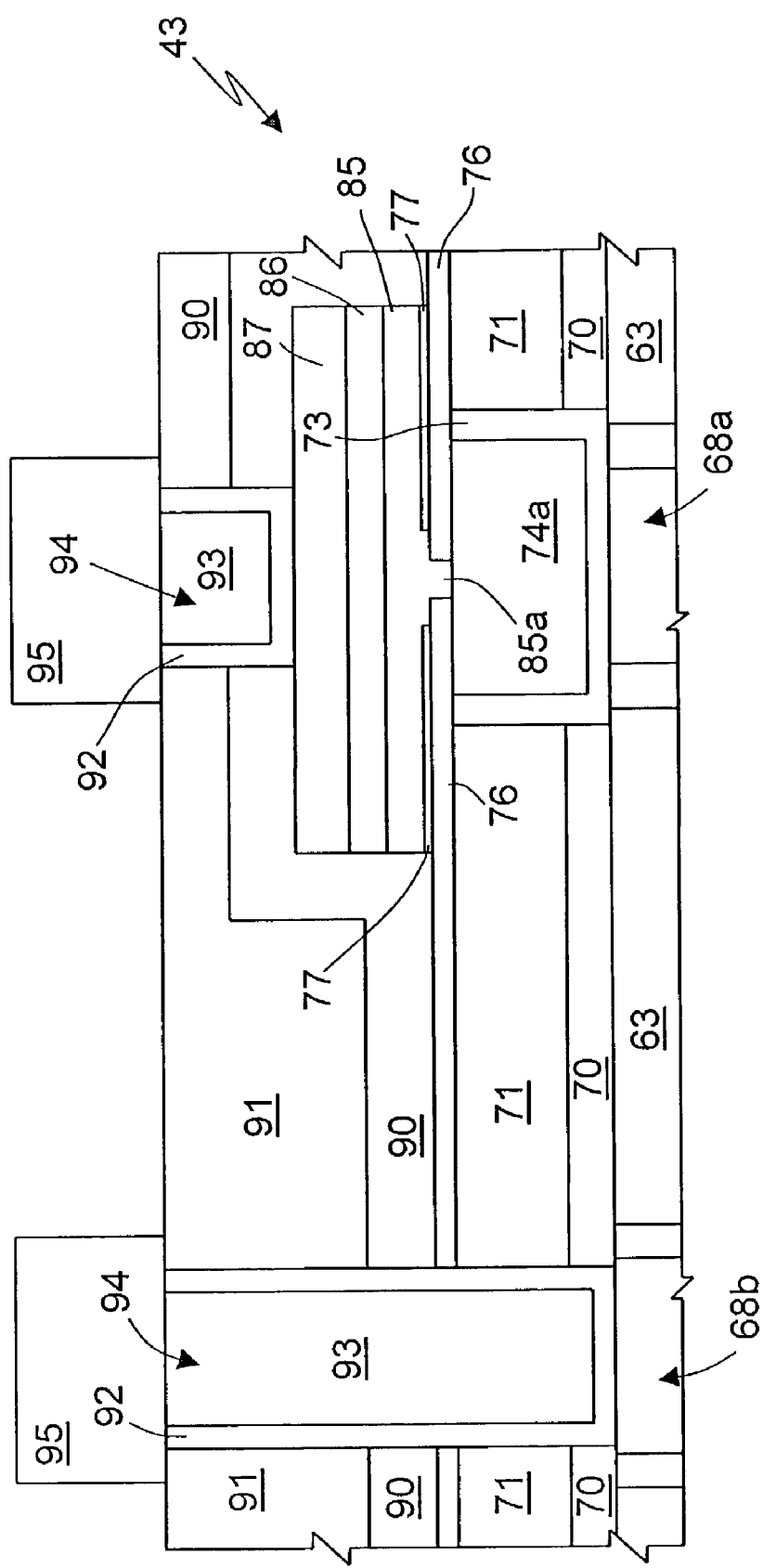

Thereafter, FIG. 25, a second metal layer 95, e.g., a multilayer of Ti/AlCu/TiN is deposed, in a per se known manner, to form a first interconnection level, and second interconnection layer 95 is defined to form connection lines in contact with the second-level plugs 94, according to the required layout.

The manufacture may continue with standard steps, such as deposition of an intermetal dielectric layer, etching and filling of vias; deposition and etching of a second metal level and deposition of the passivation.

The advantages of the present invention are clear from the above. In particular, it is outlined that the present memory and manufacturing process allow a very efficient integration, ensuring obtainment of the sublithographic contact area in both directions between the resistive electrode and the chalcogenide material. The presence of adhesion layer 77 ensures good adhesion between the chalcogenide and the underlying material with good thermal insulation properties, necessary to avoid heat dissipation. The process is completely CMOS compatible and allows integration of storage elements requiring small area.

The described process ensures formation of the thin portions 31 and 32a and contact area 33 of FIGS. 5–7 with the desired small sublithographic dimensions in a well controllable way using specific steps to be performed between standard front-end and standard back-end steps. The same process may be however used for forming contact regions as shown in FIGS. 5–7, whenever it is necessary to obtain sublithographic dimensions.

Finally, it is clear that numerous variations and modifications may be made to the contact region, the phase change memory cell and process described and illustrated herein, all falling within the scope of the invention as defined in the attached claims.

E.g., by suitably selecting the depth and doping of regions 60, 61, 64 and 65 it is possible to form a bipolar transistor as the selection element.

Figure 26:
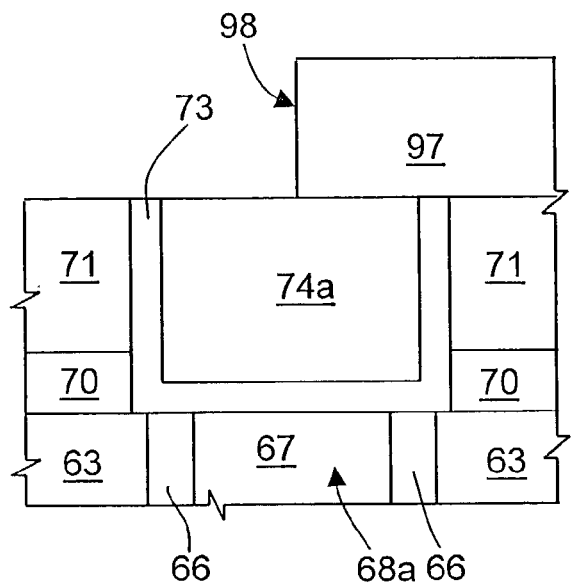
FIGS. 26–28 show cross-sections of an alternative embodiment.
Figure 27:
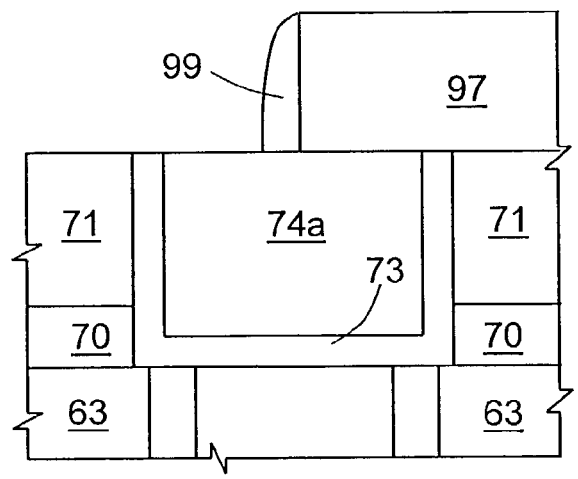
Figure 28:
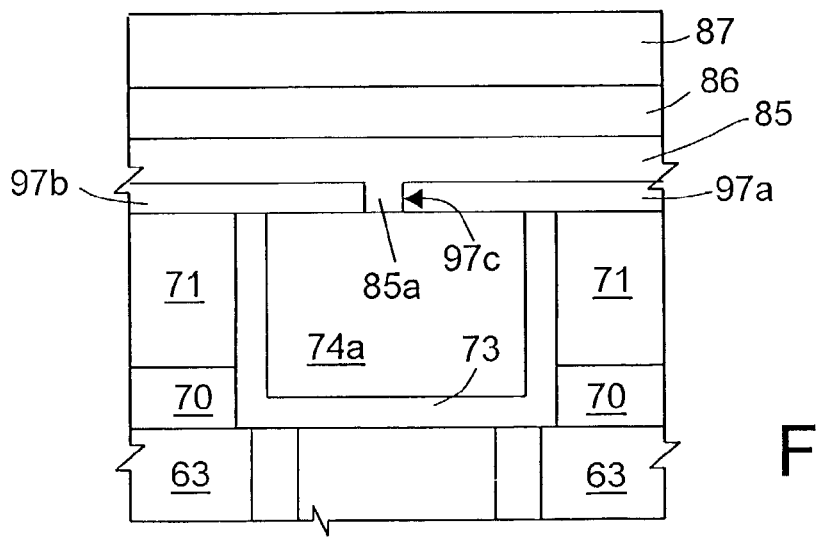

Furthermore, when an adhesion layer is not necessary, the process may be simplified, forming the delimitation layers directly on the insulating layer accommodating the resistive electrode, as shown, e.g., in FIGS. 26–28. In detail, after forming the structure of FIG. 14 and as shown in FIG. 26, a first delimitation layer 97a (analogous to first delimitation layer 78 of FIGS. 16–19) is deposited directly on second dielectric layer 71 and is shaped to form a vertical side 98, analogous to vertical side 79 of FIG. 16. Thereafter, FIG. 27, a vertical wall portion 99 extending against vertical side 98 is formed as above described for vertical wall portion 80*a* and, FIG. 28, a second delimitation layer 97*b* is deposited. Delimitation layers 97*a*, 97*b* and the vertical wall portion 99 are thinned to form a hard mask having an opening 97*c* and a sacrificial region; chalcogenic layer 85, second barrier layer 86, and a first metal layer 87 are deposed and shaped, analogously to the above embodiment.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

We claim:

1. A contact structure in an electronic semiconductor device, comprising:
   a first conducting region including a first thin portion having a first sublithographic dimension in a first direction; and
   a second conducting region including a second thin portion having a second sublithographic dimension in a second direction transverse to said first direction;
   said first and second conducting regions being in direct electrical contact at said first and second thin portions and defining a contact area having a sublithographic extension.

2. A contact structure according to claim 1, wherein said first and second sublithographic dimensions are smaller than 100 nm.

3. A contact structure according to claim 1, wherein said first and second sublithographic dimensions are smaller than 50 nm.

4. A contact structure according to claim 1, wherein said first and second sublithographic dimensions are about 20 nm.

5. A contact structure according to claim 1, wherein said second direction is perpendicular to said first direction at least in the neighborhood of said contact area.

6. A contact structure according to claim 1, comprising a first insulating layer and a second insulating layer extending on top of said first insulating layer, said first insulating layer having an opening accommodating said first conducting region and said second insulating layer having an opening accommodating said second conducting region, said second insulating layer and said second conducting region having a thickness correlated to said first and second sublithographic dimensions.

7. A phase change memory cell, comprising:
   a resistive element including a first thin portion having a first sublithographic dimension in a first direction; and
   a storage region of a phase change material including a second thin portion having a second sublithographic dimension in a second direction transverse to said first direction;
   said resistive element and said storage region being in direct electrical contact at said first and second thin portions and defining a contact area having a sublithographic extension.

8. A phase change memory cell according to claim 7, wherein said first and second sublithographic dimensions are smaller than 100 nm.

9. A phase change memory cell according to claim 7, wherein said first and second sublithographic dimensions are about 20 nm.

10. A phase change memory cell according to claim 7, wherein said second direction is perpendicular to said first direction at least in the neighborhood of said contact area.

11. A phase change memory cell according to claim 7, comprising a first insulating layer and a second insulating layer extending on top of said first insulating layer, said first insulating layer having an opening accommodating said resistive element and said second insulating layer having an opening accommodating said second thin portion, said second insulating layer and said second thin portion having a sublithographic thickness correlated to said first and second sublithographic dimensions.

12. A phase change memory cell according to claim 11, wherein said storage region has an enlarged portion extending on top of said second insulating layer and integral with said second thin portion, said phase change memory cell further comprising an adhesion layer between said second insulating layer and said enlarged portion.

13. A phase change memory cell according to claim 12, wherein said phase change material is a chalcogenide or a chalcogenide alloy and said adhesion layer is selected between titanium and polysilicon.

14. A phase change memory cell according to claim 11, wherein said first and second insulating layers are low-K materials.

15. A phase change memory cell according to claim 11, further comprising:
   a semiconductor body having a surface;
   a third insulating layer extending between said semiconductor body and said first insulating layer;
   an anode region accommodated in said semiconductor body and facing said surface;
   a cathode region accommodated in said semiconductor body and adjacent to said anode region, said cathode region having a portion facing said surface;
   a first plug extending in said third insulating layer between said resistive element and said anode region; and
   a second plug region extending in said first, second and third insulating layers and in contact with said cathode region.

16. A phase change memory cell according to claim 15, wherein said anode region is surrounded by said cathode region.

17. A phase change memory cell according to claim 16, wherein said semiconductor body includes a substrate and an epitaxial layer; said epitaxial layer accommodating a collector region extending between said cathode region and said substrate and forming a bipolar transistor with said anode and cathode regions.

18. A process for manufacturing a contact structure in an electronic semiconductor device, comprising the steps of:
   forming a first conducting region including a first thin portion having a first sublithographic dimension in a first direction;
   forming a second conducting region having a second thin portion in direct electrical contact with said first thin portion, said second thin portion having a second sublithographic dimension in a second direction transverse to said first direction;
   said first and second thin portions defining a contact area having a sublithographic extension.

19. A process according to claim 18, wherein said first and second sublithographic dimensions are smaller than 100 nm.

20. A process according to claim 18, wherein said first and second sublithographic dimensions are about 20 nm.

21. A process according to claim 18, wherein said step of forming a first conducting region comprises forming a first opening in a first insulating layer; depositing a first conducting material at least along a side wall surface of said first opening; filling said first opening with insulating material.

22. A process according to claim 21, wherein said step of forming a second conducting region comprises forming a first delimitation layer on top of said first insulating layer, said first delimitation layer having a step with a vertical side wall surface extending transversely to said first conducting layer; depositing a sacrificial portion on said vertical side wall surface; forming a second delimitation layer on top of said first insulating layer and extending on a free side of said sacrificial portion; removing said sacrificial portion to form a second opening; using said second opening to form said second thin portion.

23. A process according to claim 22, wherein said step of using said second opening comprises filling said second opening with a second conducting material.

24. A process according to claim 22, comprising, before forming a first delimitation layer, forming a mold layer on top of said first insulating layer; and said step of using said second opening comprises forming a third opening in said mold layer below said second opening; removing said first and second delimitation layers; filling said third opening with a second conducting material.

25. A process for manufacturing a phase change memory cell, comprising:
   forming a resistive element including a first thin portion having a first sublithographic dimension in a first direction;
   forming a storage region of a phase change material having a second thin portion in direct electrical contact with said first thin portion, said second thin portion having a second sublithographic dimension in a second direction transverse to said first direction;
   said first and second thin portions defining a contact area having a sublithographic extension.

26. A process according to claim 25, wherein said first and second sublithographic dimensions are smaller than 100 nm.

27. A process according to claim 25, wherein said first and second sublithographic dimensions are about 20 nm.

28. A process according to claim 26, wherein said step of forming a resistive element comprises forming a first opening in a first insulating layer; depositing a conducting material at least along a side wall surface of said first opening; and filling said first opening with insulating material.

29. A process according to claim 28, wherein said step of forming a storage region comprises forming a first delimitation layer on top of said first insulating layer, said first delimitation layer having a step with a vertical side wall surface extending transversely to said resistive element; depositing a sacrificial portion on said vertical side wall surface; forming a second delimitation layer on top of said first insulating layer and extending on a free side of said sacrificial portion; removing said sacrificial portion to form a second opening; using said second opening to form said storage region.

30. A process according to claim 29, wherein said step of using said second opening comprises filling said second opening with phase change material.

31. A process according to claim 29, comprising, before forming a first delimitation layer, forming a mold layer on top of said first insulating layer; and said step of using said second opening comprises forming a third opening in said mold region below said second opening; removing said first and second delimitation layers; filling said third opening with phase change material.

32. A process according to claim 31, comprising, after forming a mold layer and before forming a first delimitation layer, forming an adhesion layer and, before forming a third opening, opening said adhesion layer below said second opening.

33. A process according to claim 32, wherein said step of filling comprises depositing a phase change layer on said adhesion layer and patterning said phase change layer to form an enlarged portion extending on top of said adhesion layer and integral with said second thin portion.

34. A process according to claim 29, comprising, before forming a resistive element:
   forming a cathode region in a semiconductor substrate;
   forming an anode region adjacent to said cathode region;
   forming a third insulating layer on top of said semiconductor substrate;
   forming a first plug extending in said third insulating layer between said resistive region and said anode region; and
   forming a second plug region extending in said first and third insulating layers and in contact with said cathode region.

35. A contact structure according to claim 1 wherein the contact structure is a phase change memory cell, the first conducting region is a resistive element, and the second conducting region is a storage region of a phase change material.

36. A contact structure according to claim 35, wherein said first and second sublithographic dimensions are about 20 nm.

37. A contact structure according to claim 35, comprising a first insulating layer and a second insulating layer extending on top of said first insulating layer, said first insulating layer having an opening accommodating said resistive element and said second insulating layer having an opening accommodating said second thin portion, said second insulating layer and said second thin portion having a sublithographic thickness correlated to said first and second sublithographic dimensions.

38. A contact structure according to claim 37, wherein said storage region has an enlarged portion extending on top of said second insulating layer and integral with said second thin portion, said phase change memory cell further comprising an adhesion layer between said second insulating layer and said enlarged portion.

39. A contact structure according to claim 38, wherein said phase change material is a chalcogenide or a chalcogenide alloy and said adhesion layer is selected between titanium and polysilicon.

40. A contact structure according to claim 37, wherein said first and second insulating layers are low-K materials.

41. A contact structure according to claim 37, further comprising:
   a semiconductor body having a surface;
   a third insulating layer extending between said semiconductor body and said first insulating layer;
   an anode region accommodated in said semiconductor body and facing said surface;
   a cathode region accommodated in said semiconductor body and adjacent to said anode region, said cathode region having a portion facing said surface;
   a first plug extending in said third insulating layer between said resistive element and said anode region; and
   a second plug region extending in said first, second and third insulating layers and in contact with said cathode region.

42. A contact structure according to claim 41, wherein said anode region is surrounded by said cathode region.

43. A contact structure according to claim 42, wherein said semiconductor body includes a substrate and an epitaxial layer; said epitaxial layer accommodating a collector region extending between said cathode region and said substrate and forming a bipolar transistor with said anode and cathode regions.

* * * * *